(12) United States Patent
Lau (10) Patent No.: US 10,773,192 B1
(45) Date of Patent: Sep. 15, 2020

(54) METHOD AND APPARATUS FOR RECOVERING DIELECTRIC FLUIDS USED FOR IMMERSION COOLING

(71) Applicant: BitFury Group Limited, George Town, Grand Cayman (KY)

(72) Inventor: Kar-Wing Lau, Tsing Yi (CN)

(73) Assignee: Bitfury IP B.V., Amsterdam (NL)

( * ) Notice: Subject to any disclaimer, the term of this patent is extended or adjusted under 35 U.S.C. 154(b) by 0 days.

(21) Appl. No.: 16/379,136

(22) Filed: Apr. 9, 2019

(51) Int. Cl.
| | |
|---|---|
| B01D 36/00 | (2006.01) |
| H05K 7/20 | (2006.01) |
| B01D 29/56 | (2006.01) |
| B01D 5/00 | (2006.01) |
| B01D 15/08 | (2006.01) |

(52) U.S. Cl.
CPC .......... B01D 36/00 (2013.01); B01D 5/0006 (2013.01); B01D 5/006 (2013.01); B01D 5/0072 (2013.01); B01D 15/08 (2013.01); B01D 29/56 (2013.01); H05K 7/20236 (2013.01); H05K 7/20272 (2013.01)

(58) Field of Classification Search
None
See application file for complete search history.

(56) References Cited

U.S. PATENT DOCUMENTS

| | | | | |
|---|---|---|---|---|
| 2,340,898 | A * | 2/1944 | Race | H01F 27/14 174/14 R |
| 2,505,581 | A * | 4/1950 | Unger | H01F 27/14 174/14 R |
| 2,718,709 | A * | 9/1955 | Ford | H01F 27/18 34/351 |
| 2,985,706 | A * | 5/1961 | Dobry | H01F 27/14 174/14 R |
| 3,009,124 | A * | 11/1961 | Narbut | H01B 3/24 336/57 |
| 3,591,946 | A * | 7/1971 | Loe | B01D 19/0068 96/175 |
| 3,675,395 | A * | 7/1972 | Baranowski | B01D 19/0031 96/159 |
| 3,894,171 | A * | 7/1975 | Kusay | B01D 19/0063 174/14 R |
| 3,934,453 | A * | 1/1976 | Hessen | H01F 27/14 73/19.11 |
| 3,989,102 | A * | 11/1976 | Jaster | F28D 15/00 165/104.31 |
| 4,089,662 | A * | 5/1978 | Williams | B01D 1/22 196/132 |

(Continued)

Primary Examiner — Robert J Popovics
(74) Attorney, Agent, or Firm — Goodwin Procter LLP (57) ABSTRACT

A method of and system for recovering a dielectric fluid used for immersion cooling of electronic devices, the method including filtering the dielectric fluid to remove a first group of solid contaminants; distilling the filtered dielectric fluid in one or more distillation tanks to produce a vaporized dielectric fluid; separating the vaporized dielectric fluid from less volatile contaminants, such that the vaporized dielectric fluid is introduced as a condensate into a circulation tank; circulating the condensate by pumping the condensate from the circulation tank through one or more filters; filtering the circulating condensate through the filter(s) to remove a second group of contaminants; and returning the filtered condensate to the circulation tank.

19 Claims, 4 Drawing Sheets

(56) References Cited

U.S. PATENT DOCUMENTS

| | | | | |
|---|---|---|---|---|
| 4,124,834 A | * | 11/1978 | Walsh | B01D 15/00 336/58 |
| 4,236,484 A | * | 12/1980 | Lapp | H01G 13/04 118/50 |
| 4,336,414 A | * | 6/1982 | Suzuki | H01H 33/56 174/14 R |
| 4,379,746 A | * | 4/1983 | Norman | A62D 3/34 208/262.5 |
| 4,394,635 A | * | 7/1983 | Foss | H01F 27/10 174/15.1 |
| 4,437,082 A | * | 3/1984 | Walsh | C10G 25/006 174/14 R |
| 4,477,354 A | * | 10/1984 | Fessler | C10G 21/00 203/36 |
| 4,514,294 A | * | 4/1985 | Layman | A62D 3/32 210/181 |
| 4,561,866 A | * | 12/1985 | Altmann | B01D 17/048 210/188 |
| 4,578,194 A | * | 3/1986 | Reinartz | C10G 25/006 210/673 |
| 4,592,844 A | * | 6/1986 | Layman | A62D 3/32 208/262.5 |
| 4,685,972 A | * | 8/1987 | Fowler | H01F 27/14 134/109 |
| 4,699,667 A | * | 10/1987 | Walsh | C10G 21/006 134/12 |
| 4,738,780 A | * | 4/1988 | Atwood | C10G 21/006 210/634 |
| 4,744,905 A | * | 5/1988 | Atwood | B08B 3/08 134/12 |
| 4,781,826 A | * | 11/1988 | Mendiratta | A62D 3/34 210/139 |
| 4,790,337 A | * | 12/1988 | Fowler | C10G 21/006 134/109 |
| 4,814,021 A | * | 3/1989 | Massey | C10G 21/006 134/12 |
| 4,828,703 A | * | 5/1989 | Atwood | B08B 3/08 134/12 |
| 4,857,150 A | * | 8/1989 | Rival | B01D 3/06 203/41 |
| 4,879,004 A | * | 11/1989 | Oesch | B01D 11/04 203/89 |
| 4,913,178 A | * | 4/1990 | Fowler | C10G 21/006 134/12 |
| 4,950,837 A | * | 8/1990 | Horneck | C10G 25/006 174/14 R |
| 5,082,012 A | * | 1/1992 | Massey | C10G 21/006 134/109 |
| 5,082,535 A | * | 1/1992 | Oesch | B01D 11/04 134/108 |
| 5,152,844 A | * | 10/1992 | Wilwerding | A62D 3/34 134/25.1 |
| 5,167,804 A | * | 12/1992 | Tiggelbeck | B01D 15/00 210/167.32 |
| 5,211,856 A | * | 5/1993 | Shen | B01D 3/10 210/175 |
| 5,766,464 A | * | 6/1998 | Campbell | B01D 15/00 174/14 R |
| 6,217,634 B1 | * | 4/2001 | Dominelli | B01D 19/0031 174/14 R |

* cited by examiner

METHOD AND APPARATUS FOR RECOVERING DIELECTRIC FLUIDS USED FOR IMMERSION COOLING

FIELD OF THE INVENTION

The present invention relates generally to systems and methods for recovering a dielectric fluid and, more particularly, to systems and methods for recovering a dielectric fluid used for immersion cooling using multiple filtration and distillation stages.

BACKGROUND OF THE INVENTION

Dielectric fluids, e.g., refrigerants, dry-cleaning solvents, and other non-aqueous based solutions, are frequently employed to clean high technology instruments and devices, including, for example, sensitive electronics and/or electrical equipment. Conventional cleaning methods may include, for the purpose of illustration and not limitation, immersing, rinsing, spraying, vaporizing, and so forth. Disadvantageously, during repeated use in cleaning operations, dielectric fluids may become contaminated, e.g., by particles, impurities, solid substances, liquid substances, and the like.

Exemplary sources of impurities/contaminants can include printed circuit board (PCB) fluxes, plasticizers, water, and so forth. Fluxes, e.g., resin and rosin, may originally be found on the PCB but can be washed from the PCB by dielectric fluids. Typical fluxes have boiling points that may vary between about 100° C. and about 130° C. Plasticizers include additives used to improve, for example, the softness of the plastic typically found in the coatings of some electrical cables. As with fluxes, dielectric fluid washes out the plasticizers, which then remain suspended or in solution in the dielectric fluid. Due to the repeated heating and cooling of electronic equipment, water vapor in the ambient air can condense and subsequently dissolve into the dielectric fluid.

As a result of this contamination, the dielectric fluid may become less effective as a cleaning agent. In particular, repeated use of the dielectric fluid may affect the fluid's electrical resistivity, which is a measure of the fluid's resistance to the transmission of electricity, which might be harmful to the electronics and/or electrical equipment.

A recent implementation of dielectric fluids as a cleaning agent involves immersion cooling of electronic equipment, especially for single-phase or two-phase liquid cooling of electronics or other electrical items. When used repeatedly in immersion cooling, the electrical resistivity, the optical transmittance, and other properties of the dielectric fluid may be deleteriously affected. Hence, in order to ensure that the working dielectric fluid is maintained in or proximate its pure form or pure state, the dielectric fluid should remain extremely clean and essentially free of liquid and/or solid contaminants, such that electrical resistivity, optical transmittance, and other properties of the dielectric fluid remain within acceptable limits.

The high cost of some dielectric fluids suggests there may be advantages of recovery, recycling, and re-use of dielectric fluids being used, for example, in immersion cooling. However, any recovery and re-use necessitates the removal or separation of a myriad of solid and liquid contaminants from the dielectric fluid. Exemplary contaminants, for the purpose of illustration and not limitation, may include fine- to coarse-grained solid particles, liquid contaminants that do not dissolve in the dielectric fluid, liquid contaminants that partially dissolve in the dielectric fluid, and liquid contaminants that dissolve fully in the dielectric fluid. Disadvantageously, dissolved and partially dissolved liquid contaminants may form an azeotrope, making removal and separation from the dielectric fluid, e.g., by distillation, more difficult due to the common or proximate boiling points of the liquids in the azeotrope mixture.

The related art provides exemplary systems and methods for filtering and/or heating a fluid containing undesirable contaminants. However, some of these systems and methods typically cannot effectively filter and remove dissolved and/or miscible fluids.

SUMMARY OF THE INVENTION

It is, therefore, desirable to provide a system and a method for recycling a contaminated dielectric fluid used, for example, for immersion cooling of electronics and/or electrical equipment, to recover and purify the dielectric fluid, returning it to a pure or near pure state or pure or near pure form. More particularly, in one application, it may be desirable to provide a system and a method that are configured to recycle a contaminated dielectric fluid without having to interrupt the operation of an immersion cooling system in fluid communication with the cleaning and recycling system.

In a first aspect, the present invention relates to a method of recovering a dielectric fluid used for immersion cooling of one or more electronic devices. In some embodiments, the method includes filtering the dielectric fluid to remove a first group of solid contaminants (e.g., medium- to coarse-grained solid contaminants); distilling the filtered dielectric fluid in one or more distillation tanks to produce a vaporized dielectric fluid; separating the vaporized dielectric fluid from less volatile contaminants, such that the vaporized dielectric fluid is introduced as a condensate into a circulation tank; circulating the condensate by pumping the condensate from the circulation tank through one or more filters; filtering the circulating condensate through the filter(s) to remove a second group of contaminants (e.g., fine-grained, solid contaminants, very fine-grained, solid contaminants, oil, water, dissolved liquid contaminants, partially dissolved liquid contaminants, undissolved liquid contaminants, and combinations thereof); and returning the filtered condensate to the circulation tank. In one implementation, filtering the dielectric fluid to remove the first group of solid contaminants may include introducing the dielectric fluid into a mechanical filtration process that, in some variations, may consist of or consist essentially of multiple mechanical particle filters of diminishing filter pore size that may be arranged serially from a largest pore size to a smallest pore size. Optionally, in addition to filtering the contaminated dielectric fluid through a mechanical filtration process, the contaminated dielectric fluid may also be filtered through a filter with a desiccant, through a mixed carbon filter, and combinations thereof.

In some implementations, separating the vaporized dielectric fluid from less volatile contaminants may include condensing the vaporized dielectric fluid in the distillation tank(s) to produce the condensate, collecting the condensate in the circulation tank, and collecting the less volatile contaminants at a bottom portion of the distillation tank(s). In one variation, condensing includes providing, within the distillation tank(s), one or more fluid-cooled condensing coils, on which the vaporized dielectric fluid condenses, and collecting the condensate includes gravity feeding the condensate from an exterior surface of the fluid-cooled condensing coil to the circulation tank. In some variations, the one or more distillation tanks may include a first distillation tank and/or a second distillation tank or more that are in fluid communication, and separating the condensate of the vaporized dielectric fluid includes heating dielectric fluid in the first distillation tank to a first calibration temperature to vaporize the dielectric fluid, collecting the condensate of the vaporized dielectric fluid in the second distillation tank, and heating the collected condensate in the second distillation tank to a second calibrated temperature (e.g., less than the first calibrated temperature) to vaporize the collected condensate.

In some applications, filtering the circulating condensate may include passing or forcing the circulating condensate through one or more filters with a desiccant, through one or more mixed carbon filters, and/or through one or more mechanical particle filters that may consist of or consist essentially of multiple mechanical particle filters of diminishing filter pore size arranged serially from a largest pore size to a smallest pore size.

In some variations, the method may also include one or more of: interrupting distilling if a pressure in the distillation tank(s) exceeds an allowable pressure, interrupting distilling if a level of the filtered dielectric fluid in the distillation tank(s) is less than a minimum allowable fluid level, and/or interrupting circulating the condensate through the circulation tank when a desired electrical resistivity and/or a desired optical transmittance and/or a desired infra-red transmittance are measured in the condensate. In other variations, the method may also include recovering the dielectric fluid directly from an immersion cooling system and/or returning filtered condensate directly to the immersion cooling system.

In a second aspect, the present invention relates to a system for recovering a dielectric fluid used for immersion cooling of an electronic device(s). In some embodiments, the system may include a first filter device for filtering the dielectric fluid to remove a first group of solid contaminants (e.g., medium- to coarse-grained solid contaminants); one or more distillation tanks for distilling the filtered dielectric fluid to produce a vaporized dielectric fluid; a condensing device located within each distillation tank for separating a condensate of the vaporized dielectric fluid from less volatile contaminants; a circulation tank for circulating the condensate of the vaporized dielectric fluid, the circulation tank optionally including one or more pumping systems; and one or more second filter devices for filtering the circulating condensate to remove a second group of contaminants (e.g., fine-grained solid contaminants, very fine-grained solid contaminants, oil, water, dissolved liquid contaminants, partially dissolved liquid contaminants, undissolved liquid contaminants, and combinations thereof). In some applications, the first filter device and/or the second filter device may include one or more mechanical filters that may include multiple mechanical particle filters of diminishing filter pore size arranged serially from a largest pore size to a smallest pore size. In some variations, the first and/or second filter device may also include one or more filters with a desiccant and/or one or more mixed carbon filters.

In some applications, the one or more distillation tanks may include a first distillation tank and a second distillation tank that are in fluid communication, such that, after condensation, the vaporized dielectric fluid from the first distillation tank can be introduced into the second distillation tank. In some implementations, the condensing device may include one or more fluid-cooled condensing coils with an exterior surface, on which the vaporized dielectric fluid may condense.

Optionally, the system may include: an interrupt device configured to interrupt distilling if a pressure in a distillation tank exceeds an allowable pressure, an interrupt device configured to interrupt distilling if a level of the filtered dielectric fluid in a distillation tank is less than a minimum allowable fluid level, a sensing device for sensing electrical resistivity in the circulating condensate, a sensing device for sensing optical transmittance in the circulating condensate, and/or an interrupt device for interrupting circulating the condensate through the circulation tank when a desired electrical resistivity and/or a desired optical transmittance are measured in the condensate. In some variations, the system may also include a conduit for recovering the dielectric fluid directly from an immersion cooling system and/or a conduit for returning the filtered circulating condensate directly to the immersion cooling system.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described.

DETAILED DESCRIPTION

Figure 1:
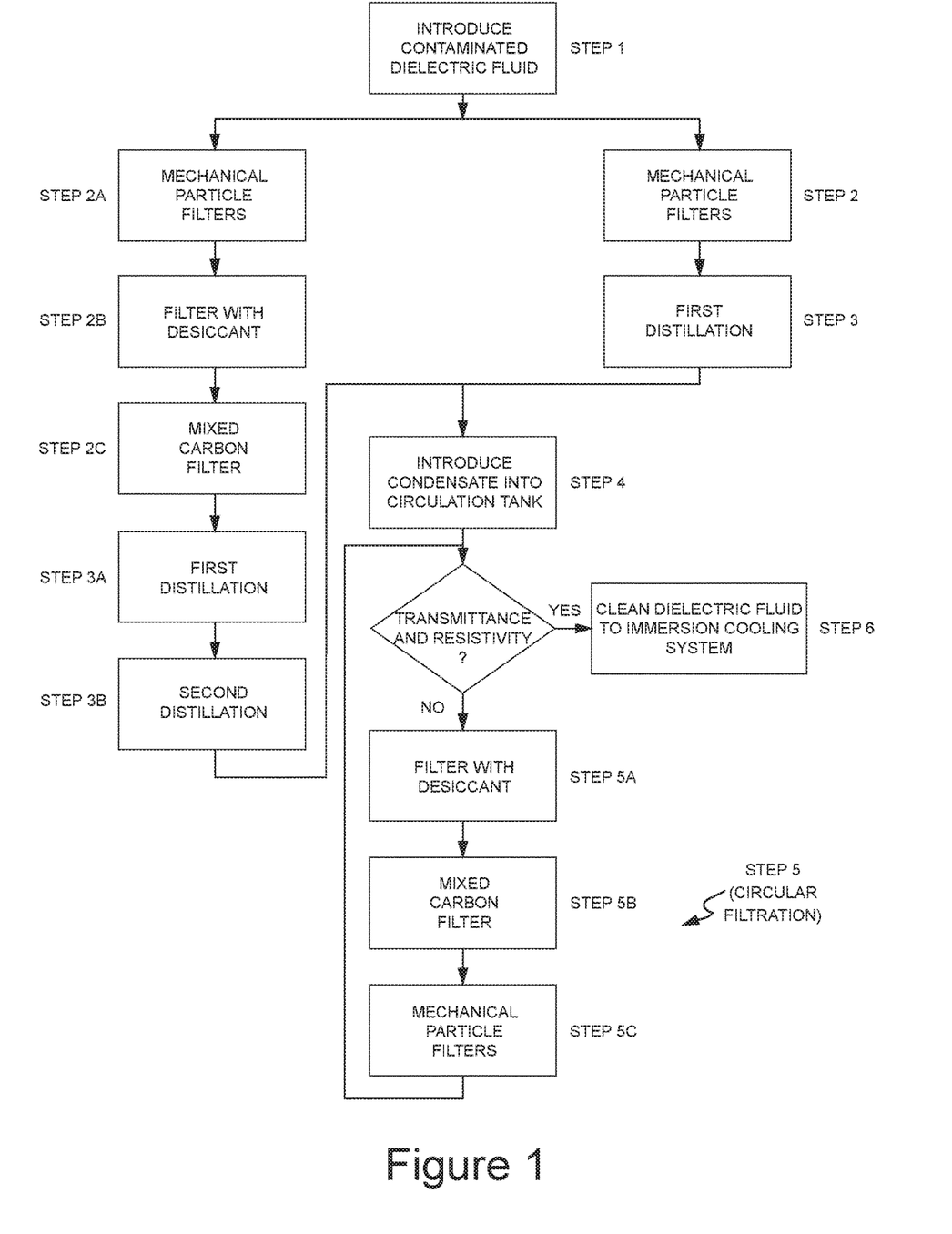
FIG. 1 is a flow chart of exemplary methods for recovering a dielectric fluid in accordance with some embodiments of the present invention.
Figure 2:
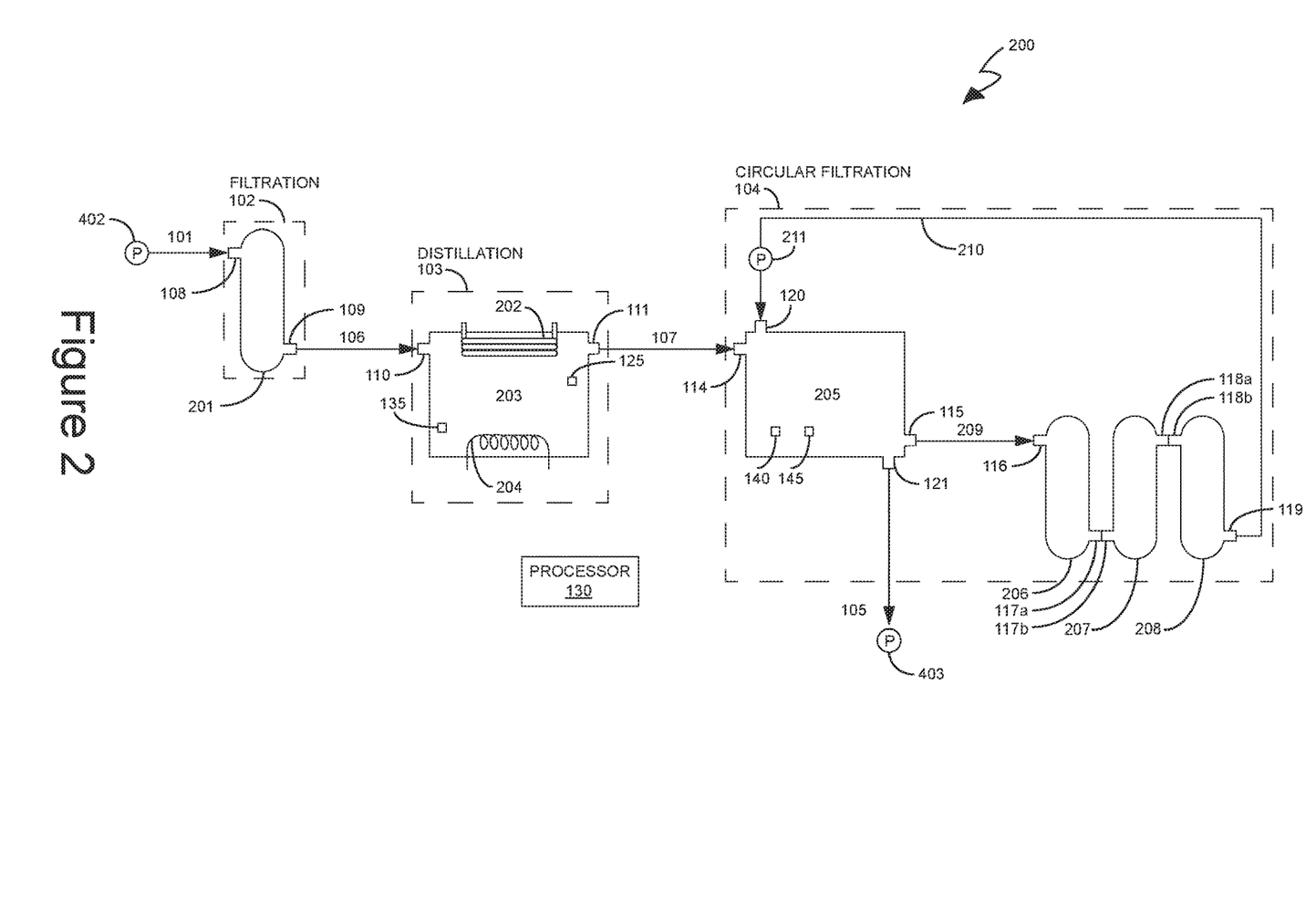
FIG. 2 is a schematic of a first system for recovering a dielectric fluid in accordance with some embodiments of the present invention.

Referring to FIGS. 1 and 2, a first embodied method and an exemplary system for performing the embodied method are shown, respectively. In a first step, a contaminated or partially contaminated dielectric fluid 101 may be introduced into a multi-stage filtration and distillation system 200 (STEP 1) for recovering the contaminated dielectric fluid 101. For the purpose of illustration and not limitation, the dielectric fluid may be an engineered fluid such as NOVEC™ 7100 manufactured by 3M™ of Saint Paul, Minn. Pure or substantially pure NOVEC™ 7100 has a boiling point of about 61° C., well below that of water, a known impurity/contaminant. In comparison, NOVEC™ 7300 has a boiling point of about 98° C., which is very close to the 100° C. boiling point of water. Those skilled in the art can appreciate that, due to their proximate boiling points, a liquid mixture containing NOVEC™ 7300 and water is more likely to form an azeotrope than a liquid mixture containing NOVEC™ 7100 and water.

Contamination of the dielectric fluid may include solid contaminants (such as, e.g., residue, debris, impurities, coarse-grained contaminants, medium-grained contaminants, fine-grained contaminants, very fine-grained contaminants, and combinations thereof) and/or liquid contaminants (such as, e.g., oil, water, dissolved liquid contaminants, partially dissolved liquid contaminants, undissolved liquid contaminants, and combinations thereof).

In some embodiments, the first stage 102 of the multi-stage filtration and distillation system 200, into which the contaminated fluid 101 may be introduced, may include a first mechanical particle filter 201 (STEP 2). The first mechanical particle filter 201 and the first stage 102 are structured and arranged to separate the dielectric fluid from larger (e.g., coarse- to medium-grained) solid and insoluble contaminants (STEP 2). In some variations, the first mechanical particle filter 201 may include a plurality of mechanical filters that are arranged serially, such that a filter element having a largest pore size—typically measured in microns—is located closest to an inlet 108 to the first stage 102 and a filter element having a smallest pore size is located closest to an outlet 109 of the first plurality of mechanical filters 201 with pore sizes of any intervening filters diminishing from the largest pore size proximate the inlet 108 to the smallest pore size proximate the outlet 109. In operation, within the first plurality of mechanical filters 201, filter elements having larger pore sizes are configured to capture and retain the coarse-grained solid contaminants, passing the medium-grained and fine- to very fine-grained solid contaminants downstream to the filter elements having smaller pore sizes and to the outlet 109. Filters having smaller pore sizes are configured to capture and retain the medium-grained, solid contaminants, passing the fine- to very fine-grained solid contaminants downstream to the outlet 109. Filters can be removed and replaced with time, as necessary, to prevent or minimize clogging.

In a next step, a processed (i.e., filtered) dielectric fluid 106 exits (e.g., flows or is pumped from) the first stage 102 (e.g., via the outlet 109 of the first mechanical particle filter 201) and is introduced into the second stage 103, e.g., via an inlet 110 in a first distillation tank 203 (STEP 3) for distillation. Prior to or concurrently during distillation, liquid impurities/contaminants that are lighter or less dense than the dielectric fluid to be recovered may be removed from the liquid mixture. More specifically, liquid impurities/contaminants that are lighter or less dense than the dielectric fluid to be recovered tend to float to the top of the liquid mixture in the distillation tank 203, on top of the denser dielectric fluid and the denser liquid contaminants, where they can be, removed, e.g., manually using a liquid scoop or siphon. For example, a liquid flux impurity composed of rosin typically has a density of about 1.07 g/cm$^3$, compared to the typical NOVEC™ 7100 density of about 1.5 g/cm$^3$. Liquid impurities/contaminants that are heavier or more dense than the dielectric fluid to be recovered will sink to the bottom of the distillation tank 203. In some variations, to remove the more dense liquid impurities/contaminants, once a majority of the processed (i.e., filtered) dielectric fluid 106 has been vaporized and the more dense liquid impurities/contaminants have sunk to the bottom of the distillation tank 203, the bottom fraction may be pumped away, for instance into a portable reservoir, so that the impurities/contaminants are removed from the distillation tank 203. The removed bottom fraction may be recovered separately if the contamination degree allows. If the removed bottom fraction is too contaminated it may be treated as unrecyclable waste.

Distillation in the second stage 103 is structured and arranged to separate a majority of the major liquid impurities/contaminants from a majority of the dielectric fluid to be recovered. Liquid impurities/contaminants having a boiling point that is appreciably higher than the boiling point of the dielectric fluid to be recovered are more easily and more completely separated from the processed (i.e., filtered) dielectric fluid 106 during distillation (STEP 3) than are liquid impurities/contaminants having a boiling point closer to the boiling point of the dielectric fluid to be recovered. Accordingly, one purpose of the second stage 103 distillation (STEP 3) is to vaporize the dielectric fluid to be recovered at a lower temperature, such that the higher boiling point liquid impurities/contaminants in the processed (i.e., filtered) dielectric fluid 106 remain in solution.

For example, recalling that NOVEC™ 7100 and NOVEC™ 7300 having boiling points of about 61° C. and about 98° C., respectively, water (with a boiling point of 100° C.) and other liquid impurities/contaminants having boiling points appreciably higher than 61° C. will be more easily and more completely separated from NOVEC™ 7100 during distillation (STEP 3) (e.g., at a boiling temperature of about 65° C.) than they would be from NOVEC™ 7300 (e.g., at a boiling temperature of about 105° C.). In short, when NOVEC™ 7100 is being used as a dielectric fluid, once the processed (i.e., filtered) dielectric fluid 106 is heated to about 65° C., the dielectric fluid to be recovered vaporizes, leaving water and other liquid impurities/contaminant having boiling points in excess of 65° C. in solution for subsequent removal.

Figure 3:
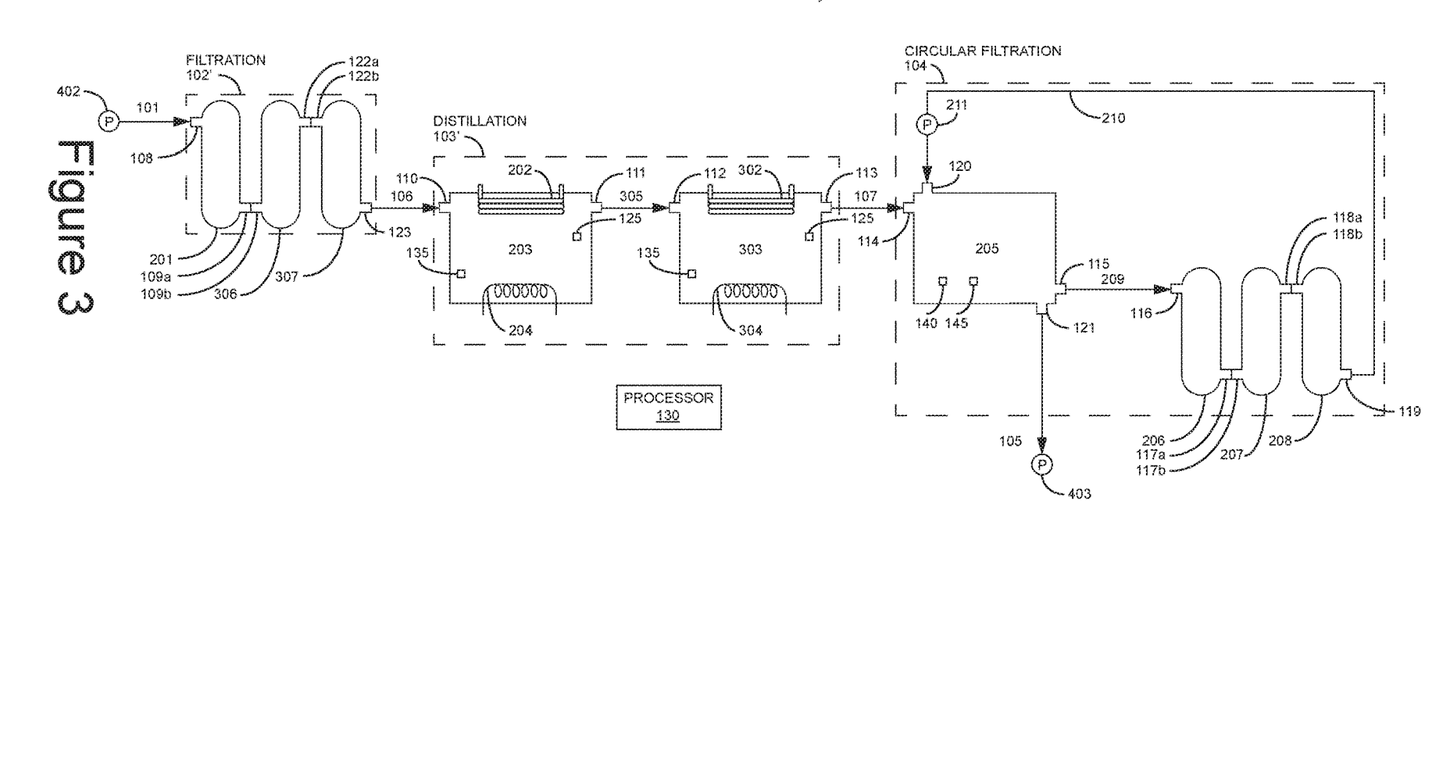
FIG. 3 is a schematic of a second system for recovering a dielectric fluid in accordance with other embodiments of the present invention.

In some implementations, the second stage 103 may include a single distillation tank 203 (FIG. 2), while in other implementations, the second stage 103' may include multiple distillation tanks 203, 303 (FIG. 3). Advantageously, second stage 103' distillation using multiple distillation tanks 203, 303 progressively separates the processed (i.e., filtered) dielectric fluid 106 from liquid impurities/contaminants that have varying or a wider range of boiling points and varying concentrations.

In pertinent part, the distillation tank 203 may include a heating element 204 located at or near a bottom surface of the distillation tank 203 and a condensing device 202 located at or near a top surface of the distillation tank 203. The heating element 204, e.g., a heating coil, may be adapted to heat the processed (i.e., filtered) dielectric fluid 106 contained in the distillation tank 203 to a calibrated temperature (e.g., a temperature slightly above the boiling temperature of the dielectric fluid in its pure or near pure state or form). In some applications, the temperature of the heating element/coil 204 can be controlled so that boiling is just maintained to achieve a maximum distillation effect. Otherwise, if the temperature of the heating element 204 is not controlled, the boiling temperature of the processed (i.e., filtered) dielectric fluid 106 may become too high compared to the boiling point of the dielectric fluid to be recovered (NOVEC™ 7100), allowing more of the impurities/contaminants to vaporize with the dielectric fluid to be recovered (NOVEC™ 7100).

In some variations, the condensing device 202 may include one or more fluid-cooled condensing coils through which a cooling fluid (e.g., water, oil, coolant, Freon, ammonia, and so forth) may be flowed or pumped. In operation, once the heating element 204 has heated the processed (i.e., filtered) dielectric fluid 106 to the calibrated boiling temperature, dielectric fluid in the distillation tank 203, as well as any liquid impurities/contaminants whose boiling point is less than that of the dielectric fluid to be recovered, vaporizes. Other liquid impurities/contaminants whose boiling points exceed the calibrated boiling temperature will remain in a liquid state in the distillation tank 203.

The vaporized dielectric fluid rises to the top of the distillation tank 203 where it contacts the exterior surface(s) of the condensing device 202. Coolant flowing or being pumped through the condensing device 202 causes the hot vapor in contact with the exterior surface(s) of the condensing device 202 (e.g., the coils) to form droplets of dielectric fluid on the coils. Advantageously, the condensing device 202 may be pitched or otherwise configured to gravity feed the droplets of processed (condensate) dielectric fluid 107 to the third stage 104 (e.g., via an outlet 111 in the distillation tank 203). The second (distillation) stage 103 (STEP 3), thus, separates the processed (condensate) dielectric fluid 107, which exits the distillation tank 203 via the outlet 111, from less volatile fluids and contaminants, which remain in a liquid or suspended state at the bottom of the distillation tank 203.

In some implementations, sensors may be incorporated into the distillation tank 203 and operatively coupled to an alarm system and/or an automatic shut-off system, respectively, to alert operators of a possible dangerous condition and/or to automatically shut-off the heater element 204 when a possible dangerous condition is imminent. For example, an overpressure may result if condensing fluid is not flowing through the condensing device 202 while the heating element 204 continues to vaporize the processed (i.e., filtered) dielectric fluid 106 in the distillation tank 203. Because condensing fluid is not flowing through the condensing device 202, there is no condensation. As a result, the density of the vapor will continue to increase as there is no means to remove the heated vapor from the distillation tank 203.

A pressure-sensing device 125 may be located within the distillation tank 203 for the purpose of sensing the pressure within the tank 203. Signals generated by the pressure-sensing devices 125 and representative of the measured pressure within the distillation tank 203 may be transmitted to a local or remote processing device 130. The processing device 130 may include software, an algorithm, a driver program, and the like or may otherwise be programmed to initiate an alarm, e.g., an optical alarm, an auditory alarm, a haptic alarm, or the like, to alert personnel of a possible dangerous condition and/or to generate a signal to cause an immediate or a delayed shutdown of the distillation tank 203 when the received signal exceeds a maximum allowable pressure for the distillation tank 203.

In another example, a liquid level-sensing device 135 may be located within the distillation tank 203 for the purpose of sensing the level of the liquid portion of the processed (filtered) dielectric fluid 106 contained within the distillation tank 203. Signals generated by the liquid level-sensing devices 135 and representative of the elevation of the liquid portion within the distillation tank 203 may be transmitted to the processing device 130. The processing device 130 may include software, an algorithm, a driver program, and the like, or may otherwise be programmed to initiate an alarm, e.g., an optical alarm, an auditory alarm, a haptic alarm, or the like to alert personnel of a possible dangerous condition and/or to generate a signal to cause an immediate or a delayed shutdown of the distillation tank 203 when the received signal falls below a minimum allowable liquid level for the distillation tank 203.

In a next step, the processed (condensate) dielectric fluid 107 exits (e.g., flows by gravity feed from) the second stage 103 (e.g., via the outlet 111 of the distillation tank 203) and is introduced into a third stage 104 (e.g., via an inlet 114 of a circulation tank 205) (STEP 4) for circular filtration (STEP 5). In some implementations, the third stage 104 may include the circulation tank 205, a plurality of filters 206, 207, 208, and a pump system 211, which are fluidically coupled to one another in a closed system. Repeatedly circulating and filtering, or circular filtering, the processed (condensate) dielectric fluid 107 in the third stage 104 (STEP 5) further purifies the dielectric fluid to be recovered. Indeed, circular filtering amplifies the chemical absorption of impurities/contaminants by the desiccant in the filter 206, increasing the amount and rate of impurities/contaminants absorbed.

In some variations of the present invention, the circulation tank 205 serves as a staging vessel for holding and mixing incoming processed (condensate) dielectric fluid 107, as well as further filtered dielectric fluid 210 that has been subjected to additional filtering to remove, for example, fine- and very fine-grained solid contaminants; miscible, dissolved, and partially dissolved liquid contaminants (e.g., azeotrope, liquid impurities having a boiling point similar to the boiling point of the dielectric fluid being recovered, and the like); and undissolved liquid contaminants (e.g., oil, water, and so forth). In some variations, one or more sensing devices may be located in the circulation tank 205 to generate signals that may be used to determine whether the liquid contained in the circulation tank 205 requires further filtering (STEP 5) or is sufficiently pure to be returned to the immersion cooling system (STEP 6). For example, in some implementations, one or more sensors 140, 145 may be incorporated into the circulation tank 205 and operatively coupled to the processing device 130, which may include software, an algorithm, a driver program, and the like or may otherwise be programmed to control whether the liquid in the circulation tank 205 exits the tank 205 via a first outlet 115 that is fluidically coupled to the second plurality of filters 206, 207, 208 or exits the tank 205 via a second outlet 121 to the immersion cooling system.

For example, in some applications, an electrical resistivity-sensing device 140 may be located in the circulation tank 205. Electrical resistivity provides a measure of the fluid's proclivity to conduct electrical current, which is undesirable. Indeed, to prevent or minimize dielectric fluid from transmitting electrical current that may damage the immersed electronic equipment being cooled in the immersion cooling system, it is desirable to retain high electrical resistivity in the dielectric fluid. Accordingly, in some implementations, when the electrical resistivity sensed or measured by the electrical resistivity-sensing device 140 is less than a minimum allowable or desired electrical resistivity, the processing device 130 may be programmed to generate signals to open the first outlet 115 and to close the second outlet 121, so that the fluid in the circulation tank 205 may be subject to further filtering within the second plurality of filters 206, 207, 208. However, when the electrical resistivity sensed or measured by the electrical resistivity-sensing device 140 equals or exceeds the minimum allowable or desired electrical resistivity, the processing device 130 may be programmed (if the optical transmittance of the liquid in the circulation tank 205 is also acceptable) to generate signals to close the first outlet 115 and to open the second outlet 121, so that clean dielectric fluid 105 may be returned to the immersion cooling system.

In some variations, the electrical resistivity-sensing device 140 may be adapted to sense the electrical resistivity of the liquid in the circulation tank 205, generating and transmitting a signal commensurate with the measured electrical resistivity to the processing device 130. An exemplary electrical resistivity-sensing device 140 may include a digital insulation/continuity tester, such as the Model 3007A manufactured by Kyoritsu of Tokyo, Japan.

In some applications, in addition to or as an alternative to an electrical resistivity-sensing device 140, an optical transmittance-measuring device 145 may also be located in the circulation tank 205. Transmittance is a measure of a liquid's ability to transmit light, which, in turn, provides indicia of the presence or absence of particulate matter and/or other solid or liquid impurities/contaminants that make the fluid in the circulation tank 205 appear cloudy or opaque. In some implementations, a target minimum transmittance greater than about 2000 MΩ may be desirable; however, an acceptable transmittance minimum value depends of the type and properties of the dielectric fluid being recovered.

In some implementations, when the optical transmittance measured or sensed by the optical transmittance-measuring device 145 is less than a minimum allowable or desired optical transmittance, the processing device 130 may be programmed to generate signals to open the first outlet 115 and to close the second outlet 121, so that the fluid in the circulation tank 205 is subject to further filtering within the second plurality of filters 206, 207, 208. However, if the optical transmittance measured or sensed by the optical transmittance-measuring device 145 equals or exceeds the minimum allowable or desired optical transmittance, the processing device 130 may be programmed (if the electrical resistivity of the fluid in the circulation tank 205 is also acceptable) to generate signals to close the first outlet 115 and to open the second outlet 121, so that clean dielectric fluid 105 is returned to the immersion cooling system. An exemplary optical transmittance-measuring device 145 may include a light source in combination with a lumen meter.

In some implementations, in addition to or as another alternative, a sensing device based on the infra-red spectroscopy might be used to determine properties of the circulating condensate. Infra-red spectroscopy exploits the fact that molecules absorb frequencies that are characteristic of their structure. These absorptions occur at resonant frequencies, i.e. the frequency of the absorbed radiation matches the vibrational frequency. The energies may be affected by the shape of the molecular potential energy surfaces, the masses of the atoms, and/or the associated vibronic coupling. It is known that the interaction indicators of infra-red radiation with matter depend on the chemical makeup of the matter examined. Thus, the more contaminants the circulating condensate contains, the more the infra-red spectrum differs from a pure dielectric fluid.

As mentioned above, the electrical resistivity-sensing device 140 may be adapted to sense the electrical resistivity of the liquid in the circulation tank 205, generating and transmitting a signal commensurate with the measured electrical resistivity to the processing device 130, while the optical transmittance-measuring device 145 may be adapted to sense the transmittance of light through the liquid in the circulation tank 205, generating and transmitting a signal commensurate with the measured transmittance to the processing device 130. When the sensed or measured electrical resistivity and/or the optical transmittance fail to satisfy their respective allowable maximum and minimum limits, the processing device 130 may be programmed to generate a signal to open the first outlet 115 and to close the second outlet 121, so that the fluid in the circulation tank 205 is subject to circulating and additional filtering within the second plurality of filters 206, 207, 208. In some embodiments, the circulating condensate 209 may be filtered through a serial sequence consisting of or consisting essentially of one or more filters with a desiccant 206 (STEP 5A), one or more mixed carbon filters 207 (STEP 5B), and one or more mechanical particle filters 208 (STEP 5C). Once the circulating condensate 209 has passed through the second plurality of filters 206, 207, 208, the further filtered condensate 210 may be returned, e.g., by pumping using a pump system 211, to the circulation tank 205 for electrical resistivity and optical transmittance testing.

The presence of water in the processed (condensate) dielectric fluid 107 as it enters the third stage 104, in circulating condensate 209, and/or further filtered condensate 210 deleteriously affects the electrical resistivity of the mixture. Hence, repeatedly circulating and filtering the processed (condensate) dielectric fluid 107, the circulating condensate 209, and/or the further filtered condensate 210 with a desiccant enables the mixture to reach a target electrical resistivity value. In some applications, any water that either was not removed during the distillation process or that was reintroduced into the processed (condensate) dielectric fluid 107 through the condensation of heated ambient air may be separated from the circulating condensate 209, for example, by filtering the circulating condensate 209 in one or more filters with a desiccant 206 (STEP 5A). For example, the circulating condensate 209 may enter and exit the filter(s) with a desiccant 206, respectively, via an inlet 116 and an outlet 117a, which is fluidically coupled to the inlet 117b of the one or more mixed carbon filters 207.

In some variations, chemical absorption (STEP 5A), e.g., using a filter containing a desiccant 206, may be used primarily to remove any remaining water that either was not removed during the distillation process or that was reintroduced into the processed (condensate) dielectric fluid 107 via the condensation of heated ambient air. If the dielectric fluid to be recovered is NOVEC™ 7100, for example, an azeotrope mixture is less likely and, accordingly, the need for chemical absorption (STEP 5A) using a filter containing a desiccant 206 to remove water is less of an issue after distillation because of the significant difference between the boiling points of NOVEC™ 7100 (61° C.) and water (100° C.). On the other hand, if the dielectric fluid to be recovered is NOVEC™ 7300, an azeotrope mixture is more likely and, hence, the need for chemical absorption (STEP 5A) using a filter containing a desiccant 206 to remove water is a greater issue after distillation because of the proximity of the boiling points of NOVEC™ 7300 (98° C.) and water (100° C.). Those skilled in the art can appreciate that the desiccant filter absorption rate is proportional to the exposed surface area of the desiccant and the time of exposure of the impurities/contaminants to the desiccant; hence, repeatedly circulating the circulating condensate 209 provides multiple opportunities for separating water from the circulating condensate 209. Exemplary filters for this purpose include, for the purpose of illustration and not limitation, a sealed, e.g., steel, tube containing a desiccant.

In the mixed carbon filter(s) 207 and mechanical particle filter(s) 208, solid, undissolved contaminants, fine- and very fine-grained solid contaminants, and heavy metal particles light enough to be transported in the vapor may be separated from the circulating condensate 209 (STEP 5B and STEP 5C). Exemplary filters for this purpose include, for the purpose of illustration and not limitation, activated carbon filters, ion exchange polymer filters, ceramic filters, and combinations thereof. In some embodiments, the circulating condensate 209 may enter and exit the mixed carbon filter(s) 207, respectively, via an inlet 117b and an outlet 118a, which is fluidically coupled to the inlet 118b of the one or more mechanical particle filters 208. In some variations, the mechanical particle filters 208 may include a plurality of mechanical filters that are arranged serially, such that a filter element having a largest pore size is located closest to an inlet 118b of the mechanical particle filters 208 and a filter element having a smallest pore size is located closest to an outlet 121 of the mechanical particle filters 208, with pore sizes of any intervening filters diminishing from the largest pore size at the inlet 118b to the smallest pore size at the outlet 121. In operation, filters having larger pore sizes are configured to capture and retain fine-grained solid contaminants, passing the very fine-grained solid contaminants. Filters having smaller pore sizes are configured to capture and retain these very fine-grained solid contaminants.

A further filtered condensate 210 exits the mechanical particle filters 208, as well as the plurality of filters 206, 207, 208, e.g., via an outlet 121, which is fluidically coupled to the circulation tank 205. In some variations, a pump device 211 may be located between the outlet 121 of the plurality of filters 206, 207, 208 and the inlet 120 of the circulation tank 205 to pump the circulating condensate 209 and the further filtered condensate 210 through the third stage 104. Alternatively, the pump device 211 may be located between the outlet 115 of the circulation tank 205 and the inlet 116 of the plurality of filters 206, 207, 208.

The circulating condensate 209 and further filtered condensate 210 may be cycled through the circulation tank 205 and the plurality of filters 206, 207, 208 in the third stage 104 (STEP 5) as many times as necessary to return the dielectric fluid to a pure or near pure form or state that satisfies electrical resistivity and optical transmittance requirements.

Referring to FIGS. 1 and 3, a second embodiment of an illustrative system 200' for recovering a dielectric fluid used for immersion cooling an electronic device(s) is depicted. In some implementations, the embodied system 200' may include a first stage 102', second stage 103', and third stage 104 as previously described, however, with the modifications made to the first 102' and second stages 103'. For example, in one modification, the first stage 102' may include a plurality of filters 201, 306, 307, rather than only a mechanical particle filter(s) 201 as previously described in connection with the first embodied system 200. Compared to the filtration system of the modified first stage 102', the filtration system of the (unmodified) first stage 102 is smaller and cheaper to put together; however, it may require greater maintenance and down time, e.g., to maintain, change filters, and so forth. The (unmodified) first stage 102 would also be a better choice if there will likely be a large amount of coarse- to medium-grained solid contaminants. In another modification, the second stage 103' may include a plurality of distillation tanks 203, 303 configured in a serial configuration. Advantageously, multiple distillation steps and tanks 203, 303 provide more effective removal of higher boiling point liquid impurities/contaminants.

In some embodiments, when the modified first stage 102' includes a plurality of filters 201, 306, 307, the filters may be arranged serially with a mechanical particle filter(s) 201 to remove debris and coarse- to medium-grained solid contaminants (STEP 2A) as previously described located closest to an inlet 108 that may be fluidically coupled to the immersion cooling tank. Downstream of the mechanical particle filter(s) 201 may be one or more filters with a desiccant 306 to remove water (STEP 2B). Downstream of the filter(s) with a desiccant 306 may be one or more mixed carbon filters 307 (STEP 2C) to remove, for example, solid, undissolved contaminants, fine- and very fine-grained solid contaminants, and heavy metal particles. The outlet 123 of the mixed carbon filter(s) 307 may be in fluid communication with the second stage 103'. Advantages of providing a plurality of filters 201, 306, 307 in the first stage 102' include, for example, lowering the boiling point of the mixture, thereby potentially reducing the time and energy needed to distill the mixture and that additional pre-filtering (prior to distillation) may enable the system 200' to operate longer before maintenance is needed.

In some applications, once the contaminated dielectric fluid 101 has been filtered through the mechanical particle filter(s) 201 (STEP 2A), liquid impurities/contaminants, e.g., water, may be separated from the processed (mechanically-filtered) dielectric fluid, for example, by filtering the processed (mechanically-filtered) dielectric fluid in one or more filters with a desiccant 306 (STEP 2B). Advantageously, removal of water prior to distillation may decrease the boiling point of the mixture and, hence, the energy and the time needed to complete the distillation, depending, of course, on the boiling point of the dielectric fluid being recovered. In operation, processed (mechanically-filtered) dielectric fluid may enter and exit the filter(s) with a desiccant 306, respectively, via an inlet 109$b$, which may be fluidically coupled to the outlet 109$a$ of the mechanical particle filter(s) 201, and an outlet 122$a$, which may be fluidically coupled to the inlet 122$b$ of one or more mixed carbon filter(s) 307.

In the mixed carbon filter(s) 307, solid, undissolved contaminants, fine- and very fine-grained solid contaminants, and heavy metal particles may be separated from the processed (desiccated) dielectric fluid (STEP 2C). In operation, the processed (desiccated) dielectric fluid may enter and exit the mixed carbon filter(s) 307, respectively, via the inlet 122$b$ and an outlet 123, which may be fluidically coupled to the inlet 110 of the second stage 103'.

In a second modification, the second stage 103' may include multiple distillation tanks 203, 303 and, as a result, multiple distillation processes. Advantageously, multiple distillation tanks 203, 303 and multiple distillation processes allow for more effective separation of the dielectric fluid to be recovered from liquid impurities/contaminants having boiling points higher than that of the dielectric fluid to be recovered. For example, the boiling point of NOVEC™ 7100 is 61° C., the boiling point of water is 100° C., the boiling points of various fluxes range between 100° C. and 130° C., while other impurities/contaminants (e.g., plasticizers, oil, and so forth) may have even higher boiling points. As a result, a processed (filtered and desiccated) dielectric fluid combining some portions of these impurities with the NOVEC™ 7100 dielectric fluid in the first distillation tank 203 may have a mixture boiling temperature of about 65° C. If this mixture is heated to a temperature of 66° C., the condensate 305 collected in the second distillation tank 303 will have a higher proportion of the NOVEC™ 7100 dielectric fluid and lower proportions of water and other liquid impurities/contaminants and, as a result, may have a boiling point of 62° C., instead of 65° C. If, in the second distillation tank 303, the condensate 305 mixture is heated to a temperature of 63° C., the process (distilled) dielectric fluid 107 flowing to the third stage 104 will have an even higher proportion of the NOVEC™ 7100 dielectric fluid and lower proportions of water and other impurities/contaminants.

Although FIG. 3 shows two distillation tanks 203, 303, those of ordinary skill in the art can appreciate that the second stage 103' may include more than two distillation tanks 203, 303 and more than two distillation processes. In an implementation including the two depicted distillation tanks 203, 303, a first condensate 305 produced by a first distillation process (STEP 3A) that heated the processed (filtered and desiccated) dielectric fluid 106 flowing (or pumped) from the mixed carbon filter(s) 307 at a first calibrated temperature may be subject to a second distillation process (STEP 3B) that heats the first condensate 305 at a second calibrated temperature. Typically, the first calibrated temperature is higher than the second calibrated temperature and, to separate the dielectric fluid from liquid impurities/contaminants having boiling points greater than the boiling point of the dielectric fluid to be recovered, both the first and the second calibrated temperatures exceed the boiling point of the dielectric fluid to be recovered.

In pertinent part, each distillation tank 203, 303 may include a heating element 204, 304, e.g., heating coils, located at or near the respective bottom surfaces of the distillation tanks 203, 303 and a condensing device 202, 302 located at or near the respective top surfaces of the distillation tanks 203, 303. In some variations, the condensing device 202, 302 may include one or more fluid-cooled condensing coils through which a cooling fluid having a relatively high specific heat capacity (e.g., water, oil, coolant, Freon, ammonia, and so forth) may flow or be pumped. In operation, once each heating element 204, 304 has heated the liquid contained in the distillation tank 203, 303 to the appropriate calibrated temperature, the dielectric fluid vaporizes. The vaporized dielectric fluid rises to the top of the distillation tanks 203, 303 where the vaporized dielectric fluid contacts an exterior surface(s) of the condensing devices 202, 302. Coolant flowing through or being pumped through the condensing devices 202, 302 causes the hot vapor in contact with the exterior surfaces of the condensing devices 202, 302 (e.g., the coils) to form droplets on the coils. Advantageously, the first condensing device 202 may be pitched or otherwise configured to gravity feed the droplets of processed (condensate) dielectric fluid 305 into the second distillation tank 303 (e.g., via an inlet 112), where the processed (condensate) dielectric fluid 305 is heated to a second, lower calibrated temperature. The first distillation process of the second stage 103', thus, separates the processed (condensate) dielectric fluid 305, which exits the first distillation tank 203 via the outlet 111, from less volatile fluids and contaminants, which remain in a liquid or suspended state at the bottom of the first distillation tank 203.

In some applications, the second condensing device 302 also may be pitched or otherwise configured to gravity feed the droplets of processed (condensate) dielectric fluid 107 into the third stage 104 (e.g., via an outlet 113 in the second distillation tank 303). The second stage 103', thus, separates the processed (condensate) dielectric fluid 107, which exits the second distillation tank 303 via the outlet 113, from less volatile fluids and contaminants, which remain in a liquid or suspended state at the bottoms of the first 203 and second distillation tanks 303.

In some implementations, sensors may also be incorporated into the second distillation tank 303 and operatively coupled to an alarm system and/or an automatic shut-off system, respectively, to alert operators of a possible dangerous condition and/or to automatically shut-off the heater element 304 when a possible dangerous condition is imminent. For example, an overpressure may result if the condensing fluid is not flowing through the condensing device 302 while the heating element 304 continues to vaporize the condensate 305 in the second distillation tank 303. Because condensing fluid is not flowing through the condensing device 302, there is no condensation. As a result, the density of the vapor will continue to increase as there is no means to remove the heated vapor from the second distillation tank 303.

A pressure-sensing device 125 may be located within the second distillation tank 303 for the purpose of sensing the pressure within the second distillation tank 303. Signals generated by the pressure-sensing devices 125 and representative of the measured pressure within the second distillation tank 303 may be transmitted to a local or remote processing device 130. The processing device 130 may include software, an algorithm, a driver program, and the like or may otherwise be programmed to initiate an alarm, e.g., an optical alarm, an auditory alarm, a haptic alarm, or the like, to alert personnel of a possible dangerous condition and/or to generate a signal to cause an immediate or a delayed shutdown of the second distillation tank 303 when the received signal exceeds a maximum allowable pressure for the second distillation tank 303.

In another example, a liquid level-sensing device 135 may be located within the second distillation tank 303 for the purpose of sensing the level of the liquid portion of the condensate 305 contained within the second distillation tank 303. Signals generated by the liquid level-sensing devices 135 and representative of the elevation of the liquid portion within the second distillation tank 303 may be transmitted to the processing device 130. The processing device 130 may include software, an algorithm, a driver program, and the like, or may otherwise be programmed to initiate an alarm, e.g., an optical alarm, an auditory alarm, a haptic alarm, or the like to alert personnel of a possible dangerous condition and/or to generate a signal to cause an immediate or a delayed shutdown of the second distillation tank 303 when the received signal falls below a minimum allowable liquid level for the second distillation tank 303.

In a next step, the processed (condensate) dielectric fluid 107 exits (e.g., flows by gravity feed from) the second stage 103' (e.g., via the outlet 113 of the second distillation tank 303) and is introduced into the third stage 104 (e.g., via an inlet 114 to a circulation tank 205) (STEP 4), as previously described. In some implementations, the third stage 104 may include the circulation tank 205, a plurality of filters 206, 207, 208, and a pump system 211, which are fluidically coupled to one another in a closed system, as previously described. By repeatedly circulating the processed (condensate) dielectric fluid 107 in the third stage 104 through the filters 206, 207, 208, the chemical absorption of impurities/contaminants by the desiccant in the filter 206 and the absorption rate increase.

Figure 4:
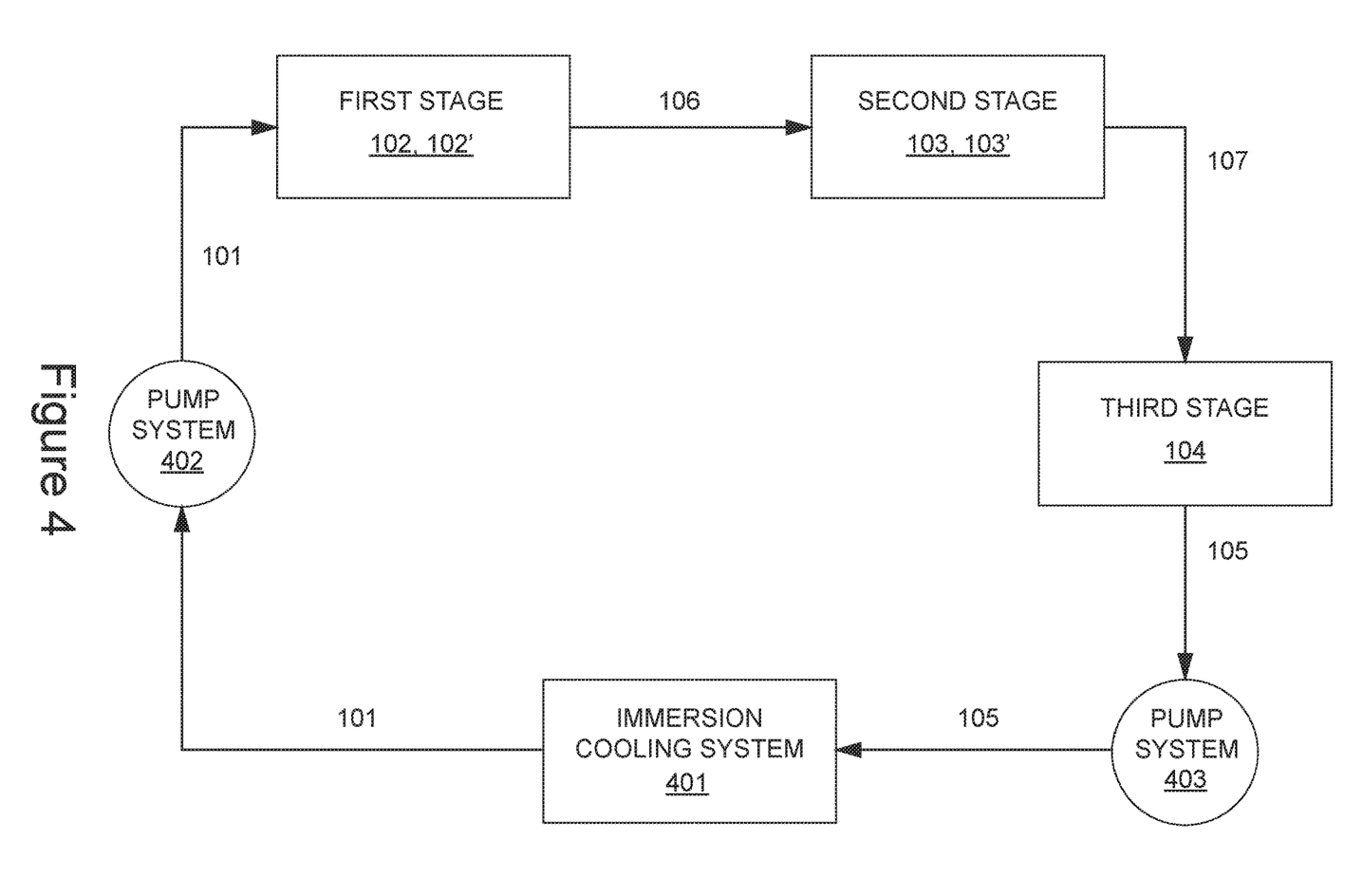
FIG. 4 is a block diagram of a system for recovering a dielectric fluid from an immersion cooling system in accordance with further embodiments of the present invention.

Either embodied systems 200, 200' described hereinabove may be a stand-alone system or, advantageously, as depicted in FIG. 4, may be integrated into or included with an immersion cooling system 401, such that the inlets 108 of the first stages 102, 102' and the outlets 121 of the third stages 104 are in fluid communication with the immersion cooling system 401. Preferably, integrating or including either of the systems 200, 200' into or with an immersion cooling system 401, is feasible, economical, and practical when there is a constant flow rate into and out of the system 200, 200'. For example, as long as the output rate of the recovered dielectric fluid 105 exiting the third stage 104 is equal to (or exceeds) the input rate of the contaminated dielectric fluid 101 into the first stage 102 either of the systems 200, 200' may be effectively integrated into or included with an immersion cooling system 401. It may not be economical, however, to couple the systems 200, 200' to the immersion cooling system 401 if the output rate of the recovered dielectric fluid 105 exiting the third stage 104 greatly or more than slightly exceeds the input rate of the contaminated dielectric fluid 101 into the first stage 102. In contrast, if the output rate of the recovered dielectric fluid 105 exiting the third stage 104 is less than the input rate of the contaminated dielectric fluid 101 into the first stage 102, then the systems 200, 200' may not be effectively integrated into or included with an immersion cooling system 401.

Alternatively, in some applications, the immersion cooling system 401 may include a buffer tank to store excess contaminated dielectric fluids so that contaminated dielectric fluid 101 may only flow into the first stage 102, 102' through the pump system 402 if the liquid level of the buffer tank of the immersion cooling system 401 exceeds a certain pre-defined threshold. In some alternative applications, the third stage 104 may include a buffer tank to store cleaned dielectric fluids, such that cleaned dielectric fluid 105 may only flow into the immersion cooling system through the pump system 403 if the liquid level of the buffer tank of the third stage 104 exceeds a certain pre-defined threshold.

In some applications, one or more pump systems 402, 403 may be incorporated into the conduits between the embodied systems 200, 200' and the immersion cooling system 401. For example, as shown in FIG. 4, a first pump system 402 may be installed between the immersion cooling system 401 and the inlets 108 of the first stages 102, 102' to deliver (i.e., pump) contaminated dielectric fluid 101 to the first stages 102, 102' while a second pump system 403 may be installed between the immersion cooling system 401 and the outlets 121 of the third stage 104 to deliver (i.e., pump) recovered dielectric fluid 105 to the immersion cooling system 401.

Advantageously, the multiple stages of filtration and distillation of the present invention may achieve a level of purity comparable to factory fresh dielectric fluid, e.g., in its pure form or pure state, as evidenced by the electrical resistivity and optical transmittance measurements taken in the circulation tank 205 before the recovered dielectric fluid 105 is released to return to the immersion cooling system 401.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of recovering a liquid dielectric used for immersion cooling of at least one electronic device, the method comprising:
    filtering the liquid dielectric to remove a first group of solid contaminants;
    distilling the filtered liquid dielectric in at least one distillation tank to produce a vaporized dielectric gas;
    condensing the vaporized dielectric gas in the at least one distillation tank at a calibrated temperature to produce a condensate;
    separating the condensate from less volatile contaminants, wherein the condensate is introduced into a circulation tank disposed downstream of the distillation tank;
    circulating the condensate by pumping the condensate through the circulation tank disposed downstream of the distillation tank;
    filtering the circulating condensate using at least one filter disposed downstream of the distillation tank to remove a second group of contaminants; and
    returning the filtered condensate to the circulation tank disposed downstream of the distillation tank.

2. The method of claim 1, wherein filtering the liquid dielectric to remove the first group comprises introducing the liquid dielectric into a mechanical filtration process disposed upstream of the distillation tank.

3. The method of claim 2, wherein the mechanical filtration process comprises filtering the liquid dielectric through a plurality of mechanical particle filters of diminishing filter pore size.

4. The method of claim 3, wherein the mechanical filtration process comprises filtering the liquid dielectric through the plurality of mechanical particle filters arranged serially from a largest pore size to a smallest pore size.

5. The method of claim 1, wherein filtering the liquid dielectric to remove the first group comprises introducing the liquid dielectric into a filter with a desiccant.

6. The method of claim 1, wherein filtering the liquid dielectric to remove the first group comprises introducing the liquid dielectric into a mixed carbon filter.

7. The method of claim 1 further comprising:
    collecting the less volatile contaminants at a bottom portion of the at least one distillation tank.

8. The method of claim 7, wherein the at least one distillation tank comprises a first distillation tank in fluid communication with a second distillation tank and producing and separating the vaporized dielectric gas comprises:
    heating liquid dielectric in the first distillation tank to a first calibrated temperature to vaporize the liquid dielectric;
    collecting the condensate of the vaporized dielectric gas in the second distillation tank; and
    heating the collected condensate in the second distillation tank to a second calibrated temperature to vaporize the collected condensate.

9. The method of claim 8, wherein the second calibrated temperature is less than the first calibrated temperature.

10. The method of claim 1, wherein condensing comprises providing, within the at least one distillation tank, at least one fluid-cooled condensing coil on which the vaporized dielectric gas condenses.

11. The method of claim 10, wherein collecting the condensate comprises gravity feeding the condensate from a surface of the fluid-cooled condensing coil to the circulation tank.

12. The method of claim 1, wherein filtering the circulating condensate comprises filtering the circulating condensate through at least one filter with a desiccant.

13. The method of claim 1, wherein filtering the circulating condensate comprises filtering the circulating condensate through at least one mixed carbon filter.

14. The method of claim 1, wherein filtering the circulating condensate comprises filtering the circulating condensate through at least one mechanical particle filter.

15. The method of claim 14, wherein filtering the circulating condensate comprises filtering the circulating condensate through a plurality of mechanical particle filters of diminishing filter pore size.

16. The method of claim 15, wherein filtering the circulating condensate comprises filtering the circulating condensate through the plurality of mechanical particle filters arranged serially from a largest pore size to a smallest pore size.

17. The method of claim 1 further comprising interrupting distilling if a pressure in any of the at least one distillation tank exceeds an allowable pressure.

18. The method of claim 1 further comprising interrupting distilling if a level of the filtered liquid dielectric in any of the at least one distillation tank is less than a minimum allowable fluid level.

19. The method of claim 1 further comprising interrupting circulating the condensate through the circulation tank when at least one of a desired electrical resistivity, a predetermined infra-red spectroscopy, or a predetermined optical transmittance is measured in the circulating condensate.

* * * * *